United States Patent
Itou et al.

(10) Patent No.: US 8,872,528 B2
(45) Date of Patent: Oct. 28, 2014

(54) CAPACITIVE PHYSICAL QUANTITY DETECTOR

(75) Inventors: Hirokazu Itou, Ichinomiya (JP); Kazuki Mikamo, Obu (JP)

(73) Assignee: DENSO CORPORATION, Kariya (JP)

( * ) Notice: Subject to any disclaimer, the term of this patent is extended or adjusted under 35 U.S.C. 154(b) by 544 days.

(21) Appl. No.: 13/225,673

(22) Filed: Sep. 6, 2011

(65) Prior Publication Data

US 2012/0056630 A1    Mar. 8, 2012

(30) Foreign Application Priority Data

Sep. 8, 2010  (JP) .................................. 2010-201312
Feb. 8, 2011  (JP) .................................. 2011-25204

(51) Int. Cl.
    *G01R 27/26*    (2006.01)
    *G01P 15/125*   (2006.01)

(52) U.S. Cl.
    CPC ........... *G01P 15/125* (2013.01); *G01R 27/2605* (2013.01)
    USPC ......................................................... 324/679

(58) Field of Classification Search
    CPC ............................. G01R 27/2605; H03G 3/008
    USPC .................... 324/658–690; 178/18.06, 19.03; 345/173, 174
    See application file for complete search history.

(56) References Cited

U.S. PATENT DOCUMENTS

| | | | | |
|---|---|---|---|---|
| 3,514,759 A | * | 5/1970 | Watanabe et al. | 360/43 |
| 3,525,948 A | * | 8/1970 | Sherer et al. | 330/51 |
| 4,441,082 A | * | 4/1984 | Haque | 330/129 |
| 5,051,707 A | * | 9/1991 | Fujita | 330/279 |
| 5,929,706 A | * | 7/1999 | Haruta et al. | 330/279 |
| 2002/0011108 A1 | | 1/2002 | Aoyama et al. | |
| 2004/0226377 A1 | | 11/2004 | Tsugai | |
| 2008/0216572 A1 | | 9/2008 | Aoyama | |

FOREIGN PATENT DOCUMENTS

| | | |
|---|---|---|
| GB | 2262609 A | 6/1993 |
| JP | A-9-257406 | 10/1997 |
| JP | A-9-280806 | 10/1997 |
| JP | A-11-220395 | 8/1999 |
| JP | A-2000-155142 | 6/2000 |

(Continued)

OTHER PUBLICATIONS

Office Action dated Sep. 11, 2012 issued in corresponding JP Application No. 2011-025204.

(Continued)

*Primary Examiner* — Melissa Koval
*Assistant Examiner* — Daniel Miller
(74) *Attorney, Agent, or Firm* — Posz Law Group, PLC

(57) ABSTRACT

A capacitive physical quantity detector includes: a capacitor having an electrostatic capacitance changeable with physical quantity; a converter converting a capacitance change to a voltage; and a selector having a comparator and a switching element. The converter includes a C-V converting circuit having an operational amplifier for amplifying a first signal from the capacitor, a main switch between input and output terminals of the operational amplifier, feedback capacitors and feedback switches. Each feedback switch connects a feedback capacitor to the main switch when the feedback switch is closed. The selector closes the feedback switches based on a second signal of the converter. The comparator compares the second signal with a threshold voltage. The switching element switches the feedback switches according to a third signal from the comparator to set the second signal smaller than a saturated voltage and larger than the threshold voltage.

9 Claims, 6 Drawing Sheets

(56) References Cited

FOREIGN PATENT DOCUMENTS

| | | | |
|---|---|---|---|
| JP | 2002098712 A | * | 4/2002 |
| JP | A-2002-98712 | | 4/2002 |
| JP | A-2002-271203 | | 9/2002 |
| JP | A-2005-55381 | | 3/2005 |
| JP | A-2008-312195 | | 12/2008 |

OTHER PUBLICATIONS

Office Action mailed Jun. 4, 2013 in corresponding JP patent application No. 2011-025204 (and English translation).

* cited by examiner

CAPACITIVE PHYSICAL QUANTITY DETECTOR

CROSS REFERENCE TO RELATED APPLICATIONS

This application is based on Japanese Patent Application No. 2010-201312 filed on Sep. 8, 2010, and No. 2011-25204 filed on Feb. 8, 2011, the disclosures of which are incorporated herein by reference.

TECHNICAL FIELD

The present invention relates to a capacitive physical quantity detector for detecting a physical quantity based on a capacitance change.

BACKGROUND

Conventionally, as described in JP-A-2002-98712, a capacitive physical quantity detector includes a sensor element having a capacitance, which is changeable according to a physical quantity, and a C-V converting circuit for converting the capacitance change of the sensor element to a voltage. The C-V converting circuit includes an operational amplifier, a switching element disposed between an input terminal and an output terminal of the operational amplifier, multiple feedback capacitors, and a selector for selecting a feedback capacitor connecting in parallel to the switching element according to an external signal. The detection range of the physical quantity such as acceleration in the capacitive physical quantity detector can be changeable according to the external signal.

The capacitance change of the sensor element depends on the acceleration. The capacitance change provides to accumulate charges in the feedback capacitor. The voltage of the signal output from the C-V converting circuit is in proportion to the charges accumulated in the feedback capacitor, and in reverse proportion to an electrostatic capacitance of the feedback capacitor. Accordingly, when the applied acceleration is small, and the electrostatic capacitance of the feedback capacitor is large, the voltage of the output signal from the C-V converting circuit is small. Thus, it is difficult to detect the acceleration. On the other hand, when the applied acceleration is large, and the electrostatic capacitance of the feedback capacitor is small, the voltage of the output signal from the C-V converting circuit may be saturated, so that the acceleration is not detected accurately.

Thus, the detection range of the acceleration depends on the electrostatic capacitance of the feedback capacitor. When the large acceleration is detected, the feedback capacitor having the large electrostatic capacitance is connected in parallel to the switching element. When the small acceleration is detected, the feedback capacitor having the small electrostatic capacitance is connected in parallel to the switching element. Thus, the acceleration in a certain range is detected. Here, in a detection range of the acceleration, in which the voltage of the output signal from the C-V converting circuit is not saturated, when the feedback capacitor having much small electrostatic capacitance is selected, the voltage of the output signal from the C-V converting circuit is large, so that the acceleration is detected with high sensitivity.

In the capacitive physical quantity detector described in JP-A-2002-98712, the feedback capacitor is selected according to the external signal so that the detection range of the acceleration is adjusted. Accordingly, when the acceleration beyond the detection range of the feedback capacitor adjusted based on the external signal is applied, the detector cannot detect the acceleration. Further, in some cases, the feedback capacitor may not be selected for detecting the acceleration with high sensitivity, so that the detector cannot detect the acceleration with high sensitivity.

The output signal of the C-V converting circuit is input into an external device via a sample holding circuit, a low pass filter and an amplifier circuit. The external signal is input into a decoder as a main element of a selecting circuit. Based on the output signal from the decoder, the feedback capacitor connecting in parallel to the switching element is selected. In this case, for example, it is considered that the external signal to be input into the decoder is generated according to the signal output from the amplifier circuit to the external device. Further, the generated external signal is input into the decoder so that the feedback capacitor is selected such that the feedback capacitor is suitable for detecting the acceleration with high sensitivity and for detecting the acceleration within the detection range.

However, the output signal of the C-V converting circuit is input into the external device via a processing element including the low pass filter and disposed on an output side of the C-V converting circuit. Accordingly, the output signal is delayed by the processing element on the output side of the C-V converting circuit and an element in the external device of the detector. As a result, it is difficult to select the feedback capacitor having the detection range of detecting the acceleration in quick response to the applied acceleration.

SUMMARY

In view of the above-described problem, it is an object of the present disclosure to provide a capacitive physical quantity detector for detecting a physical quantity. A feedback capacitor suitable for detecting the applied physical quantity with high sensitivity is selected so that a detection sensitivity of the physical quantity is improved.

According to an aspect of the present disclosure, a capacitive physical quantity detector includes: a capacitance unit having an electrostatic capacitance, which is changeable according to physical quantity; a converting unit for converting a electrostatic capacitance change to a voltage; and a selecting unit. The converting unit includes a C-V converting circuit, which has an operational amplifier for amplifying an first output signal from the capacitance unit, a main switch disposed between an input terminal and an output terminal of the operational amplifier, a plurality of feedback capacitors and a plurality of feedback switches. Each feedback switch is connected in series with a corresponding feedback capacitor. Each feedback switch connects a corresponding feedback capacitor in parallel to the main switch when the feedback switch is closed. The selecting unit selects at least one of the feedback switches based on an second output signal of the converting unit so that the one of the feedback switches is closed. The selecting unit includes a comparator and a switching element. The comparator compares a voltage of the second output signal from the converting unit with a predetermined threshold voltage. The switching element switches the feedback switches according to an third output signal from the comparator so as to set a voltage of the second output signal of the converting unit smaller than a saturated voltage of the second output signal of the converting unit and larger than the threshold voltage.

In the above detector, the feedback capacitors are selected such that the second output signal from the converting unit is smaller than the saturated voltage and higher than the threshold voltage. Accordingly, even when the physical quantity out of the detection range of a predetermined feedback capacitor is applied, the feedback capacitors corresponding to the physical quantity are selected, so that the physical quantity is detected with high sensitivity. Further, the detection range of the physical quantity is enlarged.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

A capacitive physical quantity detector is suitably used for detecting acceleration as physical quantity.

(First Embodiment)

Figure 1:
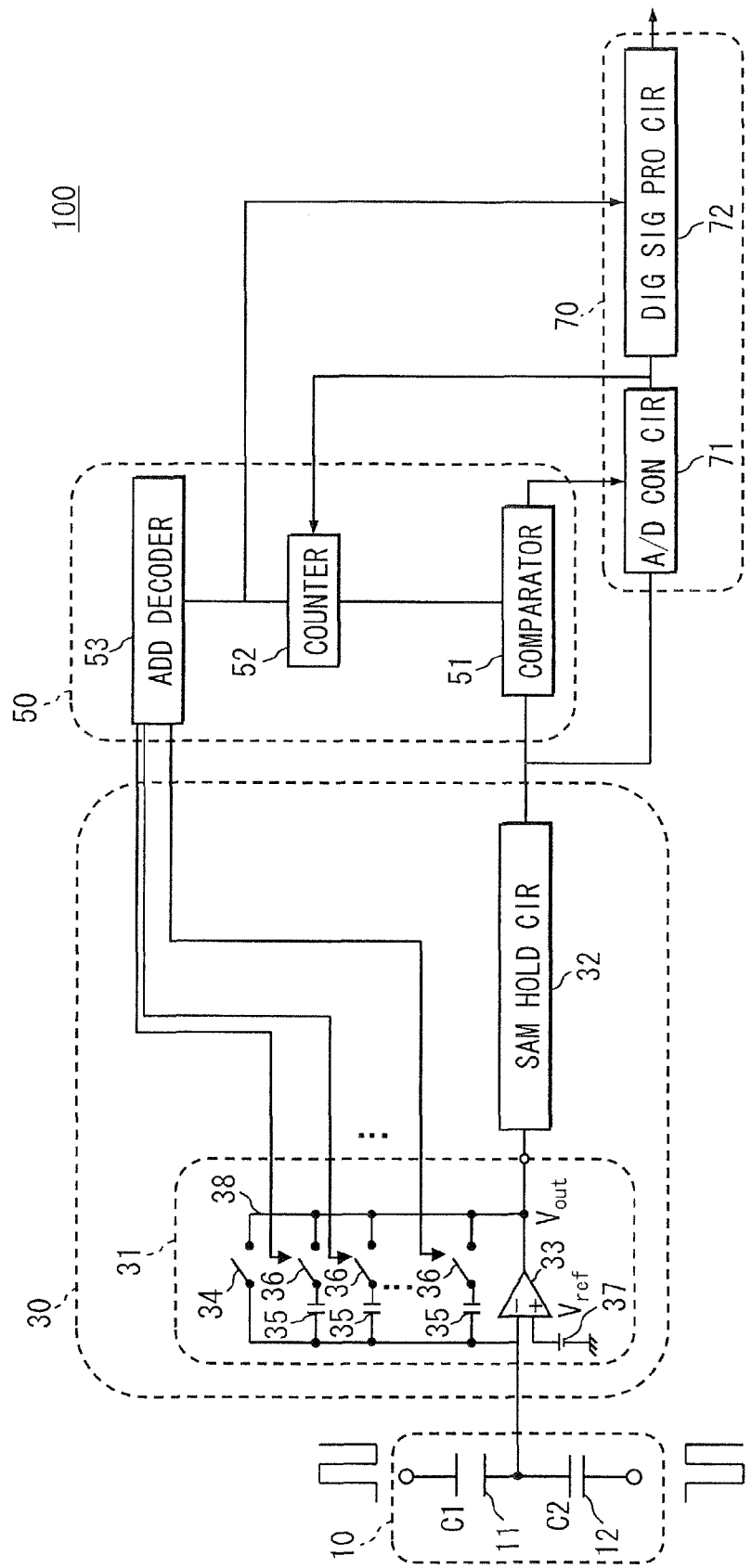
FIG. 1 is a circuit diagram showing a capacitive acceleration detector according to a first embodiment.
Figure 2:
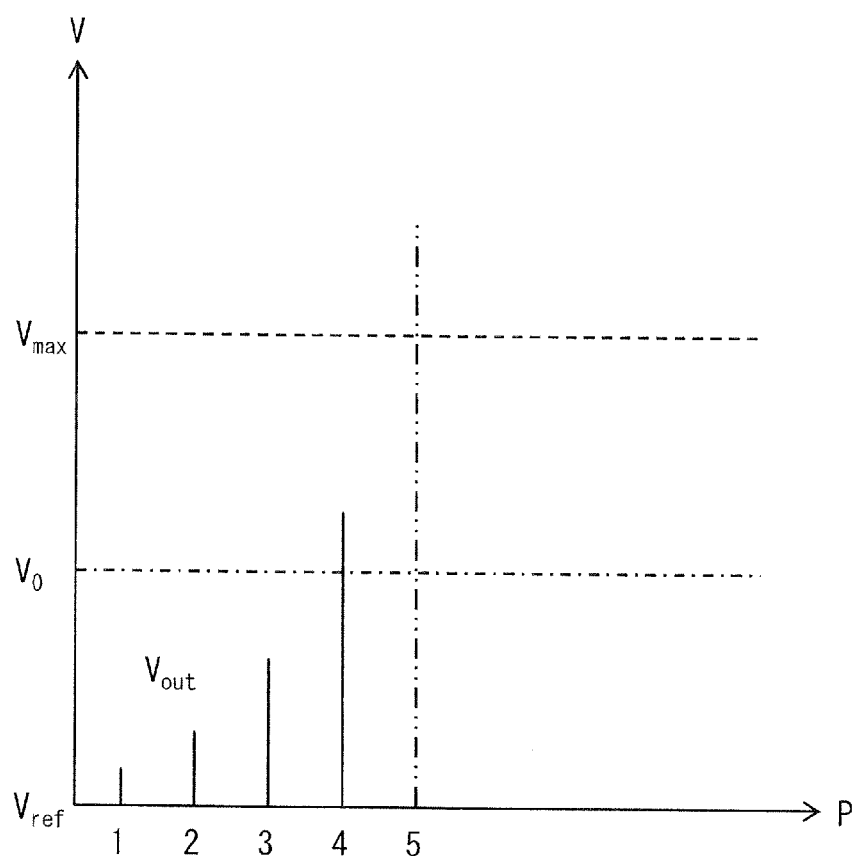
FIG. 2 is a graph showing a voltage Vout.

FIG. 1 shows a circuit diagram of a capacitive acceleration detector 100 according to a first embodiment. FIG. 2 shows a graph of a voltage Vout.

As shown in FIG. 1, the detector 100 mainly includes a sensor chip 10, a converter 30, a selector 50 and a processor 70. In the detector 100, an output signal of the sensor chip 10 is input into the converter 30. The output signal of the converter 30 is input into both of the selector 50 and the processor 70. The output signal of the selector 50 is input into both of the converter 30 and the processor 70. The output signal of the processor 70 is input to an external device.

The sensor chip 10 includes a first capacitor 11 and a second capacitor 12, each of which has an electrostatic capacitance changeable according to applied acceleration. The first and second capacitors 11, 12 are connected in series with each other. A terminal of one capacitor 11, 12, which is connected in series with a terminal of another capacitor 11, 12, is movable. A pulse signal is input into the other terminal of the one capacitor 11, 12 opposite to the terminal connected in series with the terminal of the other capacitor 11, 12. A first pulse signal is input into the first capacitor 11, and a second pulse signal is input into the second capacitor 12. The first pulse signal has a phase, which is deviated by 180 degrees from the phase of the second pulse signal. Thus, when a voltage level of each pulse signal is changed, the voltage level of the voltage applied to the other terminal of the one capacitor 11, 12 is reversed. Accordingly, when the voltage level of each pulse signal is changed, the charge amount accumulated in the capacitor 11, 12 is changed. The change amount $\Delta Q$ is input as a detection signal of the acceleration into the converting circuit 30. Each capacitor 11, 12 corresponds to a capacitive element.

A wiring for connecting two capacitors in series with each other is electrically coupled with a inverting input terminal of an operational amplifier 33 as an element in the converting circuit 30. A feedback capacitor 35 as another element in the converting circuit 30 is arranged between the inverting input terminal and an output terminal of the operational amplifier 33. The feedback capacitor 35 is connected to the inverting input terminal and the output terminal. When a main switch 34 is in an open state, the change amount $\Delta Q$ of the charge is accumulated in the feedback capacitor 35. Accordingly, a voltage determined by the change amount $\Delta Q$ of the charge and the electrostatic capacitance of the feedback capacitor 35 is generated between both ends of the feedback capacitor 35. The voltage of the feedback capacitor 35 is output from the output terminal of the operational amplifier 33. Thus, the acceleration is converted to the capacitive value in the sensor chip 10, and then, the capacitive value is converted to the voltage in the converting circuit 30.

The converting circuit 30 includes a C-V converting circuit 31 and a sample hold circuit 32. The C-V converting circuit 31 includes an operational amplifier 33, a main switch 34, a feedback capacitor 35 and a feedback switch 36.

As shown in FIG. 1, the inverting input terminal of the operational amplifier 33 is connected to the wiring, which couple the capacitors 11, 12 in series with each other. The non-inverting input terminal of the operational amplifier 33 is connected to the ground via a reference power source 37 having a reference voltage Vref. Multiple parallel wirings 38 are formed between the inverting input terminal and the output terminal of the operational amplifier 33. The number of the parallel wirings 38 is defined as N+1. N represents a natural number equal to or larger than two. The main switch 34 is arranged in the first parallel wiring 38. One feedback capacitor 35 and one feedback switch 36 are arranged in each of the second to (N+1)-th parallel wirings 38.

The open/close state of the main switch 34 and the feedback switch 36 depends on the voltage level of the pulse signal. When the voltage level of the first pulse signal is a high level, and the voltage level of the second pulse signal is a low level, the main switch 34 is closed, and all of the feedback switches 36 are closed. Thus, the charge accumulated in all of the feedback capacitors 35 is discharged. When the voltage level of the first pulse signal is a low level, and the voltage level of the second pulse signal is a high level, the main switch 34 is opened, and at leas one of the feedback switches 36 is closed, and other feedback switches 36 are opened. When the main switch 34 is closed, the charge accumulated in all of the feedback capacitors 35 is discharged. When the main switch 34 is opened, at least one of the feedback capacitors 35 accumulates the charge.

In the present embodiment, the electrostatic capacitance of each feedback capacitor 35 is the same. When the number of the feedback switches 36 to be controlled to open/close is adjusted, the number of the feedback capacitors 35 to be connected in parallel to the main switch 34 (i.e., to be connected between the inverting input terminal and the output terminal of the operational amplifier 33) is controlled. The electrostatic capacitance of the feedback capacitors 35 connected in parallel to the main switch 34 is shown by a sum of the electrostatic capacitance of the feedback capacitors 35 connected in parallel to the main switch 34. Accordingly, the electrostatic capacitance of each feedback capacitor 35 is defined as Cf. When the number of the feedback switches 36 controller to close is defined as k, a capacitor having the electrostatic capacitance of k×Cf is formed between the inverting input terminal and the output terminal of the operational amplifier 33. K represents a natural number and is equal to or smaller than N. In this case, the charge amount of $\Delta Q$ is accumulated in the feedback capacitor connected in parallel to the main switch 34, and therefore, the voltage Vout of the signal to be output from the output terminal is calculated by a formula of $\Delta Q/kCf+Vref$.

The output terminal of the operational amplifier 33 is connected to the input terminal of the sample hold circuit 32. The output terminal of the sample hold circuit 32 is connected to each of the selector 50 and the processor 70. The voltage Vout, which is temporary stored in the sample hold circuit 32, is input into each of the selector 50 and the processor 70 when the voltage level of the pulse signal is switched.

The selector 50 includes a comparator 51, a counter 52 and an address decoder 53. The output terminal of the comparator 51 is connected to an input terminal of each of the counter 52 and the A/D converting circuit 71 of the processor 70. The output terminal of the counter 52 is connected to an input terminal of each of the address decoder 53 and the digital signal processing circuit 72. The output terminal of the address decoder 53 is connected to each of the feedback switches 36 independently. The comparator 51 corresponds to a comparing element, and the counter 52 and the address decoder 53 correspond to a switching element.

The comparator 51 has a threshold voltage $V_0$, which is equal to an intermediate value between the minimum voltage Vref and the maximum voltage Vmax of the output signal from the converter 30. The maximum voltage Vmax is a saturated voltage. When the voltage level of the voltage Vout inputted into the comparator 51 is smaller than the threshold voltage $V_0$, the comparator 51 outputs a signal having a low voltage level, which is defined as a low signal (i.e., Lo signal). When the voltage level of the voltage Vout inputted into the comparator 51 is larger than the threshold voltage $V_0$, the comparator 51 outputs a signal having a high voltage level, which is defined as a low signal (i.e., Hi signal). The output signal from the comparator 51 is input into the counter 52 and the processor 70. The signal to be input into the counter 52 may not be the output signal from the comparator 51 but a control signal of a switch (not shown), which is a part of the sample hold circuit 32. The signal to be input into the processor 70, which is the output signal from the comparator 51, corresponds to a signal representing starting information of a signal processing.

The counter 52 counts the number of input times of the signals input into the counter 52. The counter 52 inputs counting information into the address decoder 53 and the processor 70. In the present embodiment, a reset signal for resetting the counting information of the counter 52 is input from the A/D converting circuit 71. When the reset signal is input into the counter 52, the number of the counting times is reset to be one. The signal to be input into the digital signal processing circuit 72 of the processor 70, which is the output signal of the counter 52, corresponds to a signal representing the information of the feedback capacitor 35 connected in series with the selected feedback switch 36.

The address decoder 53 functions to output a closing signal for closing the feedback switch 36 based on the counting information input from the counter 52. In the present embodiment, the address decoder 53 selects $(N/2^{P-1})$ feedback switches 36 when the counting number is P. Here, P represents a natural number. Each of selected feedback switches 36 is closed. Thus, when the counting number P increases, the number of the feedback capacitors 35 connecting between the inverting input terminal and the output terminal of the operational amplifier 33 is reduced to one-half.

In this case, the voltage Vout in case of the counting number P is defined as $\Delta Q/kCf$ when the voltage Vref is the reference voltage. Here, k is equal to $N/2^{P-1}$. Accordingly, as shown in FIG. 2, the voltage Vout increases from $\Delta Q/NCf$, $2\Delta Q/NCf$, $4\Delta Q/NCf$, $8\Delta Q/NCf$, and so on when the counting number P increases from 1, 2, 3, 4, and so on. Thus, as the counting number P increases, the voltage Vout increases double. In the end, the voltage Vout may exceed the threshold voltage $V_0$ and the saturated voltage Vmax. Here, in the present embodiment, the voltage Vout does not exceed the saturated voltage Vmax.

The processor 70 includes the A/D converting circuit 71 and the digital signal processing circuit 72. The output terminal of the A/D converting circuit 71 is connected to the input terminal of the digital signal processing circuit 72. The output signal from the digital signal processing circuit 72 is output to an external device. The digital signal processing circuit 72 includes a low pass filter for removing a high frequency component in the output signal of the converter 30 and an amplifier for amplifying the output signal of the low pass filter.

In the present embodiment, the output signal of the comparator 51 controls to drive the A/D converting circuit 71. When the output signal of the comparator 51 is a Hi level, the A/D converting circuit 71 functions to drive. Thus, the reset signal is input into the counter 52 when the output signal of the comparator 51 is the Hi level. Specifically, when the counting number P increases, and the voltage level of the voltage Vout to be input into the comparator 51 exceed the threshold voltage $V_0$ at the first time, the reset signal is input into the counter 52. When the reset signal is input into the counter 52, the counting number of the counter 52 is reset to be one. Then, the counter 52 starts to count the number of signal input into the counter 52 from one until the reset signal is input into the counter 52 again.

The digital signal processing circuit 72 calculates the acceleration based on the output signal of the converter 30, which is converted from an analog signal to a digital signal by the A/D converting circuit 71, and the output signal of the counter 52 as a counting signal. The digital signal processing circuit 72 calculates the electrostatic capacitance between the inverting input terminal and the output terminal of the operational amplifier 33 based on the counting signal.

Next, the change of the voltage Vout will be explained with reference to FIG. 2. The horizontal axis of FIG. 2 represents the counting number P, and the vertical axis represents the voltage Vout. The voltage Vout depending on the counting number P is shown as a vertical bar. The threshold voltage $V_0$ and the saturated voltage Vmax, which does not depend on the counting number P, are shown as a horizontal line. Specifically, the saturated voltage Vmax is shown as a broken line, and the threshold voltage $V_0$ is shown as a dashed-dotted line. The voltage Vout in a case where the counting number P is five, which exceeds the saturated voltage Vmax, and is not output actually, is shown as a dashed-two-dotted line.

As described above, the voltage level of the first pulse signal is the Hi level, and the voltage level of the second pulse signal is the Lo level, the main switch 34 is closed, and all of the feedback switches 36 are closed. In this case, the charge is accumulated in the capacitors 11, 12, and the charge accumulated in the feedback capacitors 35 is discharged.

Next, when the voltage level of each pulse signal is changed, so that the voltage level of the first pulse signal is switched to the Lo level, and the voltage level of the second pulse signal is switched to the Hi level, the main switch 34 is opened, and one of the feedback switches 36 maintains to be closed, and other feedback switches 36 are opened. In this case, the charge amount accumulated in the capacitors 11, 12 is changed, and the change amount $\Delta Q$ of charge is charged in the one of the feedback capacitors 35, which is connected in parallel to the main switch 34.

In the above case, the voltage Vout is equal to $\Delta Q/NCf$. As shown in FIG. 2, since the voltage Vout is lower than the threshold voltage $V_0$, the comparator 51 outputs the Lo signal. Accordingly, the A/D converting circuit 71 does not function to drive. The reset signal is not input into the counter 52, but the counting number of the counter 52 becomes two.

The above cycle is repeated until the voltage Vout exceeds the threshold voltage $V_0$, i.e., until the comparator 51 outputs the Hi signal. As shown in FIG. 2, when the counting number is four, the voltage Vout exceeds the threshold voltage $V_0$. In this case, the comparator 51 outputs the Hi signal. Thus, the A/D converting circuit 71 functions to drive, and the digital signal is input from the A/D converting circuit 71 to the digital signal processing circuit 72 and the counter 52. The digital signal to be input into the counter 52 is the reset signal. When the reset signal is input into the counter 52, the counting number of the counter 52 is reset to be one. The digital signal processing circuit 72 receives the digital signal of the A/D converting circuit 71 when the counting number is four. Further, the digital signal processing circuit 72 receives information such that the counting number of the counter 52 is four. Thus, the digital signal processing circuit 72 calculates the applied acceleration based on the digital signal, the counting number of four and the electrostatic capacitance Cf of the feedback capacitor 35.

Next, the advantage of the capacitive acceleration detector 100 according to the present embodiment will be explained as follows. The selector 50 connects the feedback capacitor 35 between the inverting input terminal and the output terminal of the operational amplifier 33 based on the voltage Vout of the output signal of the converter 30. At this time, the selector 50 increases the voltage Vout doubly, and the selector 50 compares the voltage Vout with the threshold voltage $V_0$, so that the selector 50 switches the feedback switches 36 so as to set the voltage Vout to be smaller than the saturated voltage Vmax and to be larger than the threshold voltage $V_0$. Thus, in the capacitive acceleration detector 100, the feedback capacitors 35 are selected such that the voltage Vout does not exceed the saturaled voltage Vmax, and the voltage Vout is higher than the threshold voltage $V_0$. Thus, since the feedback capacitors 35 are selected in accordance with the applied acceleration, the acceleration is detected with high sensitivity. Further, the detection range of the acceleration is enlarged.

In the present embodiment, the voltage Vout increases doubly from $\Delta Q/NCf$, $2\Delta Q/NCf$, $4\Delta Q/NCf$, $8\Delta Q/NCf$, and so on when the counting number P increases from 1, 2, 3, 4, and so on. The threshold voltage $V_0$, which is compared with the voltage Vout, is equal to a half of the saturated voltage Vmax.

As shown in FIG. 2, when the counting number P is one, and the voltage Vout (=$\Delta Q/NCf$) does not exceeds the threshold voltage $V_0$, the voltage Vout is smaller than a half of the saturated voltage Vmax. Thus, even when the voltage Vout is doubled, the voltage of $2\Delta Q/NCf$ does not exceed the saturated voltage Vmax. Similarly, when the voltage of $2\Delta Q/NCf$ does not exceed the threshold voltage $V_0$, the voltage of $4\Delta Q/NCf$, which is obtained by doubling the voltage of $2\Delta Q/NCf$, does not exceed the saturated voltage Vmax. Similarly, when the voltage of $4\Delta Q/NCf$ does not exceed the threshold voltage $V_0$, the voltage of $8\Delta Q/NCf$, which is obtained by doubling the voltage of $4\Delta Q/NCf$, does not exceed the saturated voltage Vmax. When the voltage of $8\Delta Q/NCf$ exceeds the threshold voltage $V_0$, the voltage of $8\Delta Q/NCf$ is larger than a half of the saturated voltage Vmax. Thus, the voltage of $16\Delta Q/NCf$, which is obtained by doubling the voltage of $8\Delta Q/NCf$, exceeds the saturated voltage Vmax.

In the present embodiment, the comparison between the voltage Vout and the threshold voltage $V_0$ is performed until the voltage Vout exceeds the threshold voltage $V_0$. In FIG. 2, the selector 50 continues to execute the comparison until the counting number P is four. The output voltage Vout of the selector 50 is set when the counting number P is four. Thus, the feedback capacitors 35 are selected in an optimum manner so that the voltage Vout is lower than the saturated voltage Vmax and higher than the threshold voltage $V_0$.

In the first embodiment, the threshold voltage $V_0$ is a half of the saturated voltage Vmax. Alternatively, the threshold voltage $V_0$ may be any. For example, the threshold voltage $V_0$ may be smaller than a half of the saturated voltage Vmax.

Figure 3:
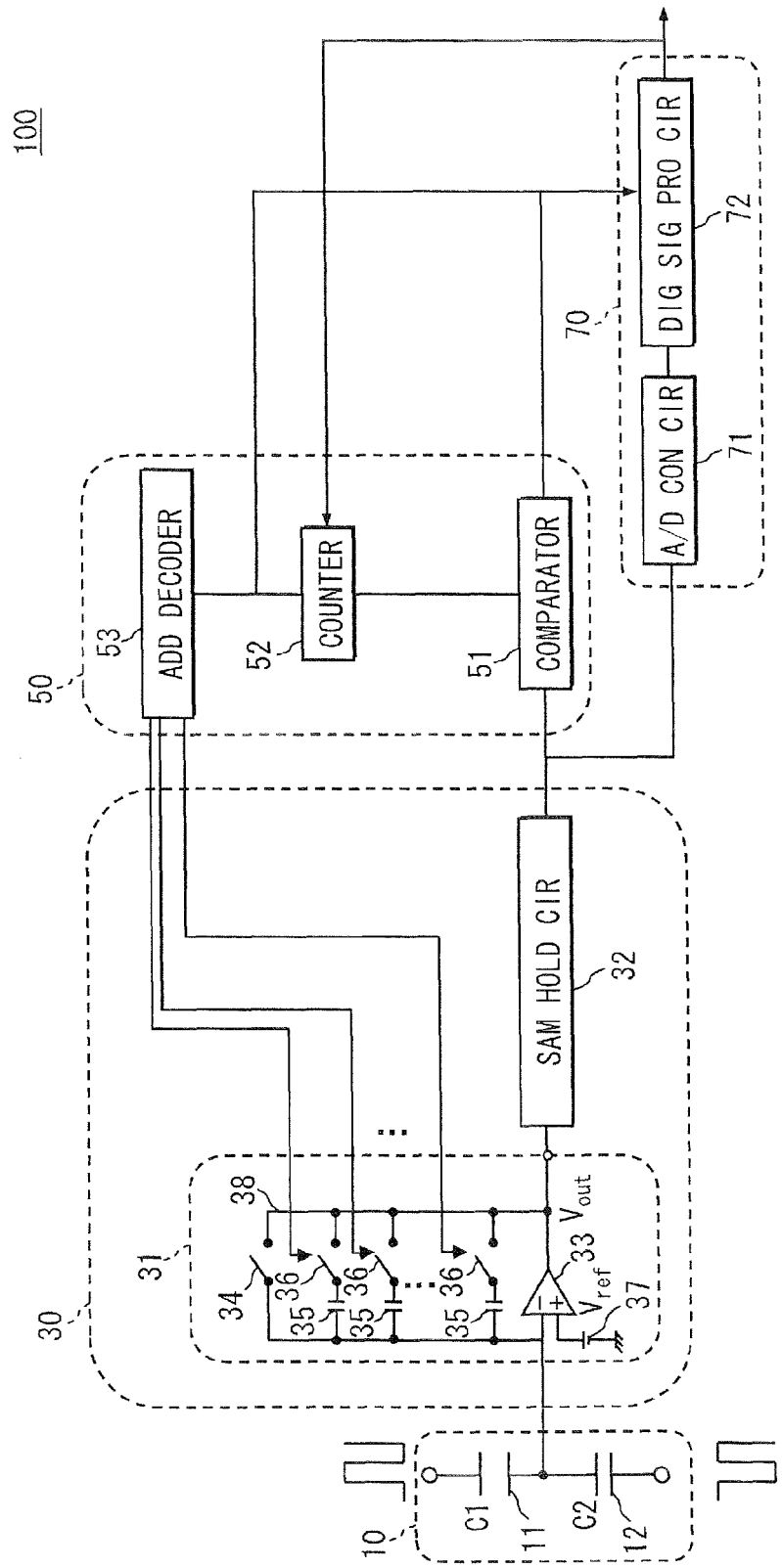
FIG. 3 is a circuit diagram showing a capacitive acceleration detector according to a modification of the first embodiment.

In the first embodiment, the output signal of the comparator 51 controls to drive the A/D converting circuit 71. Alternatively, as shown in FIG. 3, the output signal of the comparator 51 may control to drive the digital signal processing circuit 72. In this case, the output signal of the digital signal processing circuit 72 provides the reset signal of the counter 52. Further, the output signal of the comparator 51 may control to drive the A/D converting circuit 71 and the digital signal processing circuit 72. In this case, the output signal of the A/D converting circuit 71 or the digital signal processing circuit 72 provides the reset signal of the counter 52. FIG. 3 shows a circuit diagram of the capacitive acceleration detector according to a modification.

In the first embodiment, the voltage Vout is doubled when the counting number P increases. Alternatively, the voltage Vout may be reduced by half when the counting number P increases. In this case, the address decoder 53 selects $2^{P-1}$ feedback switches 36. Each of the selected feedback switches 36 is closed. Thus, the voltage Vout is set to $\Delta Q/kCf$. Here, k is equal to $2^{P-1}$. The selector 50 continues to execute the comparison between the threshold voltage $V_0$ and the voltage Vout until the output signal of the comparator 51 is reversed. The voltage Vout set by the counting number just before the output signal of the comparator 51 is reversed and the counting number p are input into the digital signal processing circuit 70. In this case, the feedback capacitors 35 are surely selected so as to set the voltage Vout lower than the saturated voltage Vmax and higher than the threshold voltage $V_0$.

In the first embodiment, the open/close state of the main switch 34 depends on the voltage level of the pulse signals. Specifically, when the voltage level of the first pulse signal is the Hi level, and the voltage level of the second pulse signal is the Lo level, the main switch 34 is closed. When the voltage level of the first pulse signal is the Lo level, and the voltage level of the second pulse signal is the Hi level, the main switch 34 is opened. Alternatively, the timing of switching the main switch 34 from the close state to the open state may be different from the above timing. For example, the main switch 34 may be opened just after the charge accumulated in the feedback capacitor 35 is discharged. Specifically, the main switch 34 may be opened just before the voltage level of the first pulse signal is switched from the Hi level to the Lo level, and the voltage level of the second pulse signal is switched from the Lo level to the Hi level.

(Second Embodiment)

Figure 4:
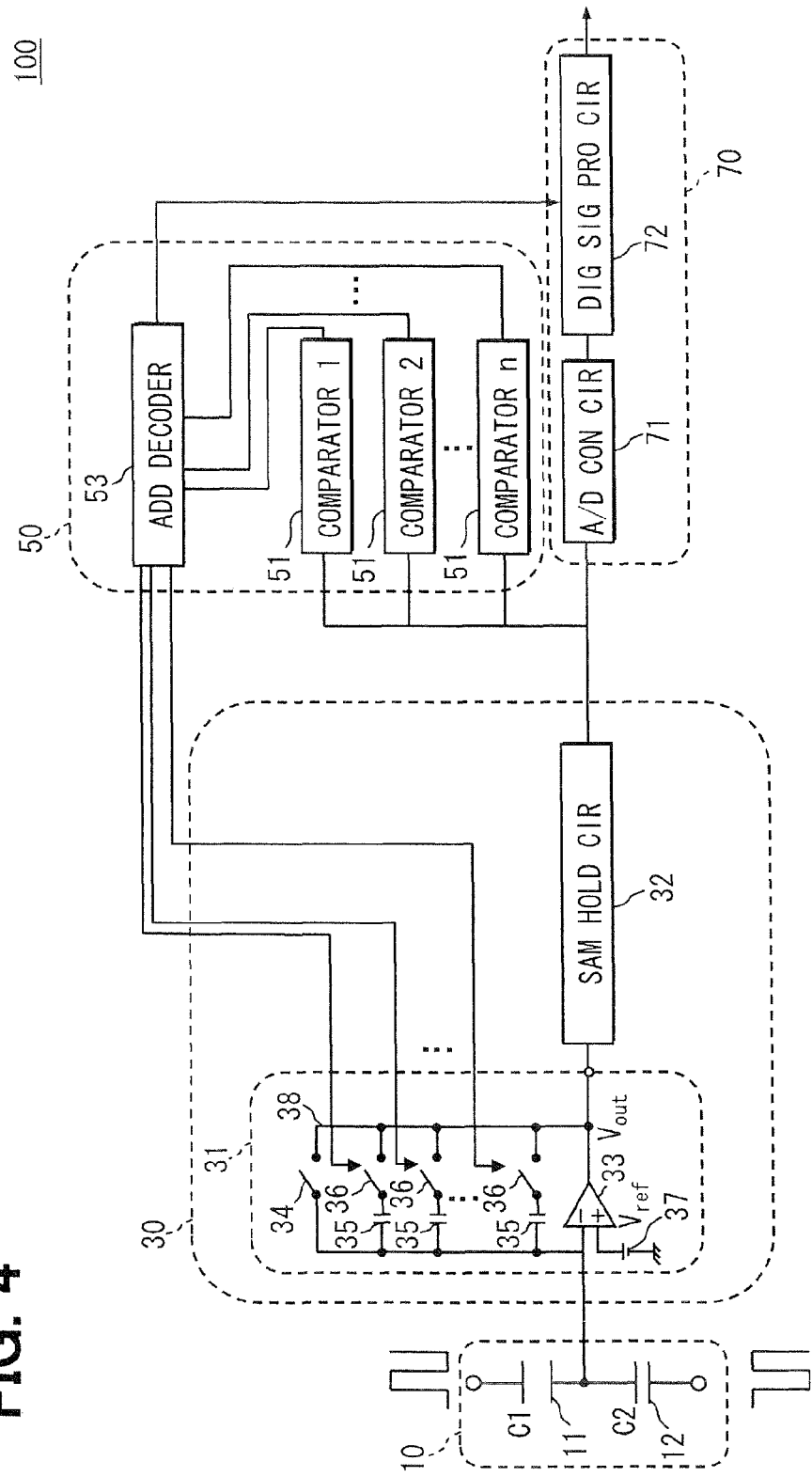
FIG. 4 is a circuit diagram showing a capacitive acceleration detector according to a second embodiment.

A second embodiment will be explained with reference to FIG. 4. FIG. 4 shows a capacitive acceleration detector 100 according to the second embodiment.

In the first embodiment, the selector 50 includes the comparator 51, the counter 52 and the address decoder 53. In the present embodiment, the selector 50 includes multiple comparators 51 and the address decoder 53. The number of the comparators 51 is defined as N. The address decoder 53 corresponds to the switching element.

The N comparators 51 have different threshold voltages $V_0$, respectively. Each threshold voltage $V_0$ is equal to or larger than the reference voltage Vref and equal to or smaller than the saturated voltage Vmax. In the present embodiment, the threshold voltage $V_0$ of the k-th comparator 51 is set to $\alpha/2^{k-1}$Cf. Here, $\alpha$ represents a positive number. When the number of k increases, the threshold voltage $V_0$ is reduced by half. The address decoder 35 stores a close signal to be input into each feedback switch 36. The close signal corresponds to a signal output from the N comparators 51 when certain feedback capacitors 35 are selected. The relationship between the output signal of the comparator 51 and the close signal of the feedback switch 36 is determined to select the feedback capacitor 35 so that the voltage Vout is lower than the saturated voltage Vmax and higher than the threshold voltage $V_0$, which is equal to a half of the saturated voltage Vmax. In this case, different from the first embodiment, it is not necessary to switch the feedback switch 36 many times. Thus, the optimum feedback capacitors 35 are selected for a short time.

In the present embodiment, the output signal of the address decoder 53 is input into the digital signal processing circuit 72. The digital signal processing circuit 72 calculates the electrostatic capacitance between the inverting input terminal and the output terminal of the operational amplifier 33 based on the output signal of the address decoder 53. The output signal of the address decoder 53 to be input into the digital signal processing circuit 72 corresponds to a signal representing the information of the feedback capacitors 35, which are connected in series with the feedback switches 34, respectively. In the present embodiment, it is not necessary to provide a signal representing the start information of the signal processing. When the signal representing the start information of the signal processing is used, the signal representing the start information of the signal processing corresponds to the output signal of the address decoder 53 to be input into the digital signal processing circuit 72.

In the present embodiment, when the initially selected feedback capacitor 35, which is connected between the inverting input terminal and the output terminal of the operational amplifier 33, has a certain electrostatic capacitance, the voltage Vout may exceed the saturated voltage Vmax. Thus, all of the voltage levels of the output signals of all comparators 51 may be Hi levels. Thus, in the present embodiment, it is preferable to set the electrostatic capacitance of the feedback capacitors, which are initially selected, to be maximum. Specifically, it is preferable to close ali of the feedback switches 36. In this case, the voltage Vout is small when certain acceleration is applied. All of the voltage levels of the output signals from all of the comparators 51 are not the Hi levels at the same time.

In the second embodiment, the k-th comparator 51 has the threshold voltage $V_0$ equal to $\alpha/2^{k-1}$Cf. When the number of k increases, the threshold voltage $V_0$ is reduced by half. Alternatively, the threshold voltage $V_0$ of each comparator 51 may be different from $\alpha/2^{k-1}$Cf.

In the second embodiment, the relationship between the output signal of the comparator 51 and the close signal of the feedback switch 36 is such that the feedback capacitor 35 is selected to set the voltage Vout smaller than the saturated voltage Vmax and higher than the threshold voltage $V_0$, which is equal to a half of the saturated voltage Vmax. Alternatively, the relationship between the output signal of the comparator 51 and the close signal of the feedback switch 36 may be different from the above relationship as long as the feedback capacitor 35 is selected to set the voltage Vout smaller than the saturated voltage Vmax and higher than the threshold voltage $V_0$. The voltage Vout in a range between the threshold voltage $V_0$ and the saturated voltage Vmax is freely set by selecting one of the threshold voltage $V_0$ according to the detection accuracy of the acceleration.

Figure 5:
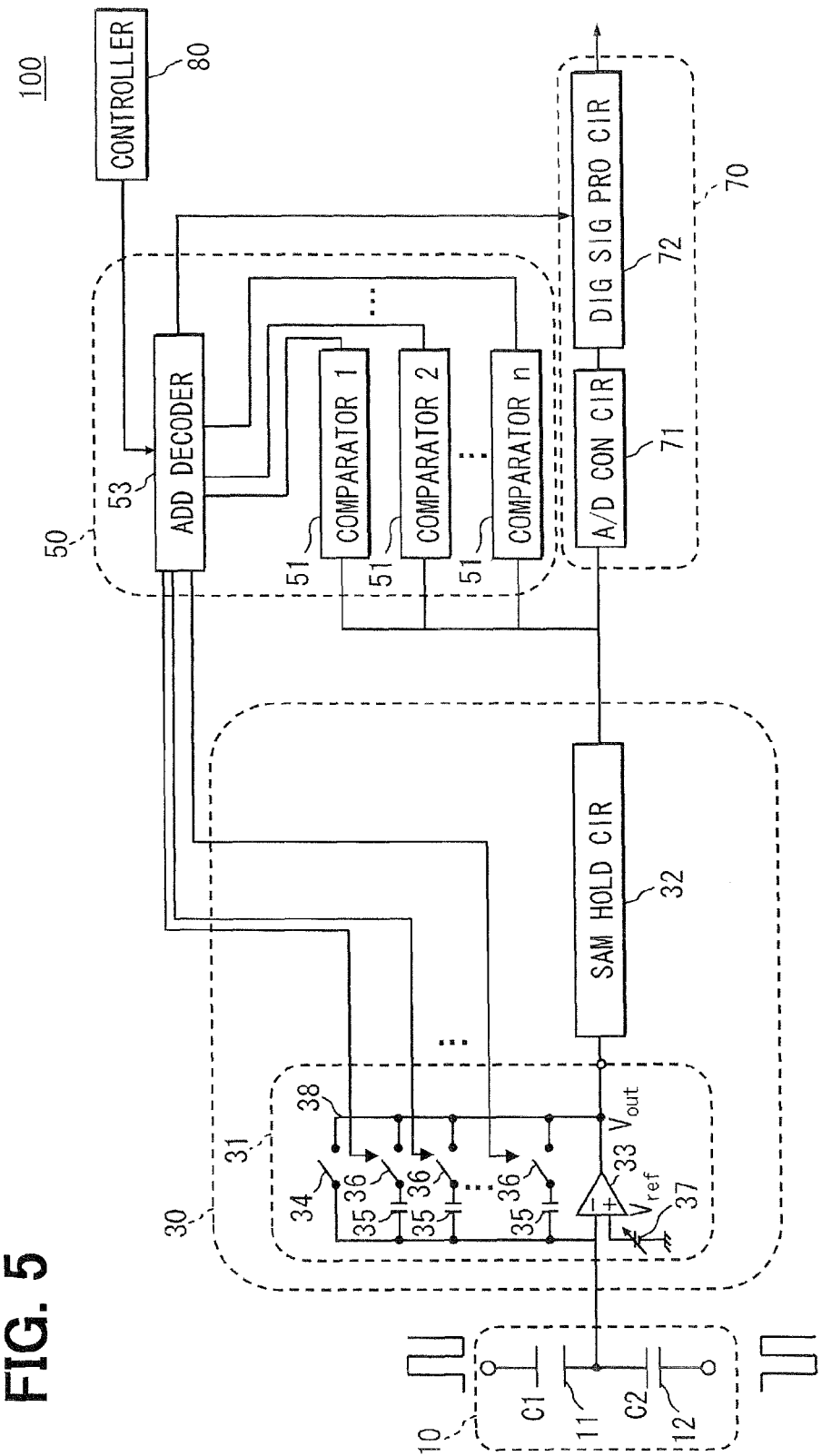
FIG. 5 is a circuit diagram showing a capacitive acceleration detector according to a modification of the second embodiment.

In the second embodiment, as shown in FIG. 5, the capacitive acceleration detector 100 may include a controller 80 for controlling the address decoder 53 forcibly. The reference power source 37 adjusts the reference voltage Vref. Thus, the operation of the address decoder 53 and the comparison of the capacitance ratio of the feedback capacitor 36 are performed. When the controller 80 forcibly controls the address decoder 53 without depending on the output signal of each comparator 51 under a condition that the reference voltage Vref is changed, so that the feedback switches 36 are selected, the output signal of the converter 30 is forcibly changed. After that, it is determined whether the output signal of the processor 70 (i.e., the digital signal processing circuit 72) corresponds to the reference voltage Vref forcibly changed and the selected feedback switch 36. Specifically, it is determined whether the output signal of the processor 70 is saturated. Thus, the detector 100 determines whether the address decoder 53 functions normally, i.e., whether the feedback switch 36 is properly selected. Further, under a condition that the reference voltage Vref is constant, the feedback switches 36 are switched in turn by the controller 80, so that the ratio of the output signals of the digital signal processing circuit 72 is detected. Thus, the ratio of capacitances of the feedback capacitors 36 is determined.

When the function of the address decoder 53 is checked, there in a method other than a method of changing the reference voltage Vref. For example, under a condition that the amplitude of the first pulse signal to be input into the first capacitor 11 is set to be different from the amplitude of the second pulse signal to be input into the second capacitor 12, the controller 80 forcibly controls the address decoder 53, and the output signal of the digital signal processing circuit 72 is checked. Thus, the detector 100 checks whether the address decoder 53 functions normally. An element for changing the amplitude of the pulse signal corresponds to an adjusting element.

When the detector 100 is mounted on a vehicle, the above self diagnosis function is performed at a time when the ignition key of the vehicle turns on. When the detector 100 does not function normally, a warning element informs the driver of the vehicle on the malfunction of the detector 100. Then, the operation of the detector 100 stops. When the detector 100 functions normally, the self diagnosis process ends. Then, the detector 100 starts to function for detecting acceleration.

In the above embodiments, the detector 100 detects the acceleration as physical quantity. Alternatively, the detector 100 may detect other physical quantity such as an angular speed.

Figure 6:
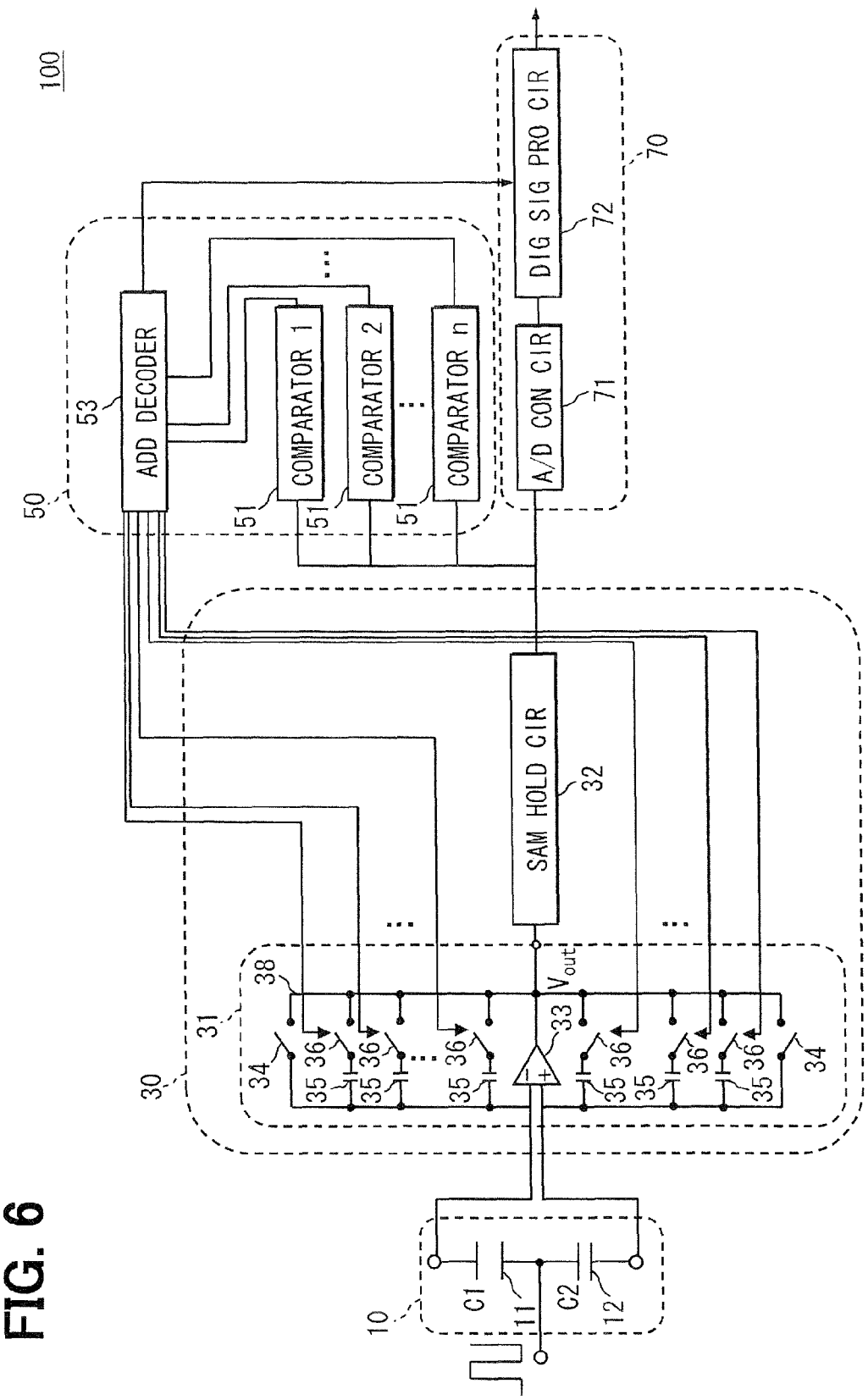
FIG. 6 is a circuit diagram showing a capacitive acceleration detector according to another modification.

In the above embodiments, the pulse signal is input into the other terminal of each capacitor 11, 12 opposite to the one terminal, which is connected in series with each other. Alternatively, as shown in FIG. 6, the pulse signal may be input to the wiring connecting between the capacitors 11, 12, so that a whole operation type detector is formed. In FIG. 6, (N+1) parallel wirings 38 are formed not only between the inverting input terminal and the output terminal of the operational amplifier 33 but also between the non-inverting input terminal and the output terminal of the operational amplifier 33. FIG. 6 shows a capacitive acceleration detector according to a modification.

In the above embodiments, the electrostatic capacitances of N feedback capacitors 35 are the same. Alternatively, the electrostatic capacitances of N feedback capacitors 35 may be different from each other. In the above embodiments, one feedback capacitor 35 is arranged in one parallel wiring 38. Alternatively, multiple feedback capacitors 35 may be arranged in one parallel wiring 38. In this case, when the feedback switch 36 to be closed is selected, the feedback capacitors 35 connected in parallel to the main switch 34 are selected.

In the above embodiments, the signal processing in the digital signal processing circuit 72 is not specified. When the signal processing is performed, the sensor sensitivity depending on an individual product of the detector 100 may be adjusted, and an error of the detector 100 generated by a parasitic capacitance of the detector 100 and/or the accuracy of the ratio of the feedback capacitors 35 at a time when the feedback capacitor 35 is switched (i.e., when the feedback capacitor 35 is selected) may be corrected. The digital signal processing circuit 72 includes the above described low pass filter, the above described amplifier, a memory (not shown) and a multiplying element (not shown). The memory stores the sensor sensitivity adjusting parameter $\alpha$ and the feedback capacitor switching error correction parameter 13, which correspond to the output signal of the selector 50 (i.e., the counter 52 or the address decoder 53). The multiplying element reads out the parameters $\alpha$, $\beta$ corresponding to the output signal of the selector 50 from the memory, and multiplies the parameters $\alpha$, $\beta$ by the signal output from the converter 30 (i.e., the sample hold circuit 32) via the A/D converting circuit 71 and the low pass filter. In this case, the sensor sensitivity is adjusted, and the error of the detector 100 at the time when the feedback capacitor is switched is corrected. Here, the parameters $\alpha$, $\beta$ are preliminary measured when the individual product of the detector 100 is manufactured. The sensor sensitivity corresponds to the electrostatic capacitance changing sensitivity. The sensor sensitivity adjusting parameter corresponds to the electrostatic capacitance change sensitivity adjusting parameter.

In the above embodiments, the memory stores the parameters $\alpha$, $\beta$. Alternatively, the memory may store an integration parameter $\gamma$, which is integrated from the parameters $\alpha$, $\beta$. In this case, the multiplying element multiplies the integration parameter $\gamma$ by the signal output from the low pass filter. Thus, the number of read-out times and the number of multiplying times in a calculator in the detector 100 are reduced from twice to once. Thus, the processing speed is increased.

The above disclosure has the following aspects.

According to an aspect of the present disclosure, a capacitive physical quantity detector includes: a capacitance unit having an electrostatic capacitance, which is changeable according to physical quantity; a converting unit for converting a electrostatic capacitance change to a voltage; and a selecting unit. The converting unit includes a C-V converting circuit, which has an operational amplifier for amplifying an first output signal from the capacitance unit, a main switch disposed between an input terminal and an output terminal of the operational amplifier, a plurality of feedback capacitors and a plurality of feedback switches. Each feedback switch is connected in series with a corresponding feedback capacitor. Each feedback switch connects a corresponding feedback capacitor in parallel to the main switch when the feedback switch is closed. The selecting unit selects at least one of the feedback switches based on an second output signal of the converting unit so that the one of the feedback switches is closed. The selecting unit includes a comparator and a switching element. The comparator compares a voltage of the second output signal from the converting unit with a predetermined threshold voltage. The switching element switches the feedback switches according to an third output signal from the comparator so as to set a voltage of the second output signal of the converting unit smaller than a saturated voltage of the second output signal of the converting unit and larger than the threshold voltage.

In the above detector, the feedback capacitors are selected such that the second output signal from the converting unit is smaller than the saturated voltage and higher than the threshold voltage. Accordingly, even when the physical quantity out of the detection range of a predetermined feedback capacitor is applied, the feedback capacitors corresponding to the physical quantity are selected, so that the physical quantity is detected with high sensitivity. Further, the detection range of the physical quantity is enlarged.

Alternatively, the comparator may switch a voltage level of the third signal according to determination whether a voltage of the second output signal is larger than the threshold voltage, and the switching element switches the feedback switches in turn so as to gradually reduce an electrostatic capacitance of the feedback capacitors connected in parallel to the main switch at every time when the switching element switches the feedback switches until the comparator switches the voltage level of the third output signal of the comparator. Further, the threshold voltage may be a half of the saturated voltage, and the switching element switches the feedback switches in turn so as to reduce the electrostatic capacitance of the feedback capacitors connected in parallel to the main switch by half at every time when the switching element switches the feedback switches until the comparator switches the voltage level of the third output signal of the comparator. The voltage Vout of the second output signal from the converting unit is provided by a sum of the reference voltage Vref of the operational amplifier and the voltage Vf applied to the selected feedback capacitor. The minimum voltage Vmin of the second output signal of the converting unit corresponds to the reference voltage Vref. The voltage Vout is varied with the voltage Vf. In order to simplify the situation, the minimum voltage Vmin is assumed to be zero, and therefore, the voltage Vout is equal to the voltage Vf.

Further, assuming that the first to fourth capacitors have the electrostatic capacitances with a ratio of 1:2:4:8, the first to fourth capacitors are connected between the input and output terminals of the operational amplifier. In this case, the switching element switches the feedback switches so that the fourth to first capacitors are connected in turn between the input and output terminals of the operational amplifier. The voltage applied to the feedback capacitor is in inverse proportion to the electrostatic capacitance of the feedback capacitor. The voltages Vf1 to Vf4 applied to the first to fourth feedback capacitors have a ratio of 8:4:2:1. When the fourth voltage Vf4 is equal to the voltage Vf, these voltages are shown as 8Vf, 4Vf, 2Vf and Vf. In this case, when the feedback switch corresponding to the fourth feedback capacitor is closed, i.e., when the fourth feedback capacitor is selected, the voltage Vout of the second output signal from the converting unit is equal to the voltage Vf. When the third feedback capacitor is selected, the voltage Vout is equal to 2Vf. When the second feedback capacitor is selected, the voltage Vout is equal to 4Vf. When the first feedback capacitor is selected, the voltage Vout is equal to 8Vf. Thus, at every time when switching element switches the feedback switches, the voltage Vout is gradually increased. In the above case, the threshold voltage $V_0$ of the comparator is a half of the saturated voltage Vmax of the second output signal of the converting unit. Accordingly, when the voltage Vf does not exceed the threshold voltage $V_0$, the voltage Vf is smaller than the half of the saturated voltage Vmax. Thus, the voltage of 2Vf obtained by doubling the voltage Vf does not exceed the saturated voltage Vmax. Similarly, when the voltage of 2Vf does not exceed the threshold voltage $V_0$, the voltage of 4Vf obtained by doubling the voltage of 2Vf does not exceed the saturated voltage Vmax. However, when the voltage of 4Vf exceeds the threshold voltage $V_0$, the voltage of 4Vf is larger than the half of the saturated voltage Vmax, and therefore, the voltage of 8Vf obtained by doubling the voltage of 4Vf exceeds the saturated voltage Vmax. Accordingly, in this case, when the second feedback capacitor is selected, the voltage of the second output signal of the converting unit is smaller than the saturated voltage and larger than the threshold voltage. Thus, the switching element selects an optimum feedback capacitor in order to set the voltage of the second output signal of the converting unit to be smaller than the saturated voltage and larger than the threshold voltage.

Alternatively, the comparator may switch a voltage level of the third signal according to determination whether a voltage of the second output signal is larger than the threshold voltage, and the switching element switches the feedback switches in turn so as to gradually increase an electrostatic capacitance of the feedback capacitors connected in parallel to the main switch at every time when the switching element switches the feedback switches until the comparator switches the voltage level of the third output signal of the comparator. Further, the threshold voltage may be a half of the saturated voltage, and the switching element switches the feedback switches in turn so as to double the electrostatic capacitance of the feedback capacitors connected in parallel to the main switch at every time when the switching element switches the feedback switches until the comparator switches the voltage level of the third output signal of the comparator. In this case, the switching element selects an optimum feedback capacitor in order to set the voltage of the second output signal of the converting unit to be smaller than the saturated voltage and larger than the threshold voltage.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A capacitive physical quantity detector comprising:
   a capacitance unit having an electrostatic capacitance, which is changeable according to a physical quantity;
   a converting unit for converting an electrostatic capacitance change to a voltage;
   a selecting unit; and
   a processor,
   wherein the converting unit includes a capacitance-voltage converting circuit, which has an operational amplifier for amplifying an first output signal from the capacitance unit, a main switch disposed between an input terminal and an output terminal of the operational amplifier, a plurality of feedback capacitors and a plurality of feedback switches,
   wherein each feedback switch is connected in series with a corresponding feedback capacitor,
   wherein each feedback switch connects a corresponding feedback capacitor in parallel to the main switch when the feedback switch is closed,
   wherein the selecting unit selects at least one of the feedback switches based on a second output signal of the converting unit so that the at least one of the feedback switches is closed,
   wherein the selecting unit includes a comparator and a switching element,
   wherein the comparator compares a voltage of the second output signal from the converting unit with a predetermined threshold voltage,
   wherein the switching element switches the feedback switches according to a third output signal from the comparator so as to set a voltage of the second output signal of the converting unit smaller than a saturated voltage of the second output signal of the converting unit and larger than the threshold voltage,
   wherein the converting unit further includes a sample hold circuit for temporary storing a fourth output signal from the operational amplifier,
   wherein the fourth output signal of the operational amplifier is input as the second output signal into the selecting unit via the sample hold circuit,
   wherein the processor processes the second output signal from the converting unit,
   wherein the second output signal from the converting unit, a first signal from the switching element representing information about the feedback capacitors connected in series with selected feedback switches, and a second signal from the comparator representing information about a start of a signal processing are input into the processor, and
   wherein the processor adjusts an electrostatic capacitance change sensitivity of the capacitance unit based on the first signal of the switching element so that the processor corrects an error at a time when the feedback capacitors are switched.

2. The capacitive physical quantity detector according to claim 1,
   wherein the comparator switches a voltage level of the third signal according to determination whether a voltage of the second output signal is larger than the threshold voltage, and wherein the switching element switches the feedback switches in turn so as to reduce an electrostatic capacitance of the feedback capacitors connected in parallel to the main switch at every time when the switching element switches the feedback switches until the comparator switches the voltage level of the third output signal of the comparator.

3. The capacitive physical quantity detector according to claim 2,
   wherein the threshold voltage is a half of the saturated voltage, and
   wherein the switching element switches the feedback switches in turn so as to reduce the electrostatic capacitance of the feedback capacitors connected in parallel to the main switch by half at every time when the switching element switches the feedback switches until the comparator switches the voltage level of the third output signal of the comparator.

4. The capacitive physical quantity detector according to claim 1,
   wherein the processor includes an A/D converting circuit and a digital signal processing circuit,
   wherein the A/D converting circuit converts the second output signal from the converting unit from an analog signal to a digital signal,
   wherein the digital signal processing circuit processes the digital signal output from the A/D converting circuit, and
   wherein the second signal representing information about the start of the signal processing is input into at least one of the A/D converting circuit and the digital signal processing circuit.

5. The capacitive physical quantity detector according to claim 4,
wherein the digital signal processing circuit includes a low pass filter and an amplifier,
wherein the low pass filter removes a high frequency component in the second output signal of the converting unit, and
wherein the amplifier amplifies a fifth output signal from the low pas filter.

6. The capacitive physical quantity detector according to claim 1,
wherein the processor multiplies an electrostatic capacitance change sensitivity adjusting parameter and a feedback capacitor switching error correction parameter by the second output signal of the converting unit, so that the electrostatic capacitance change sensitivity is adjusted, and the error is corrected, and
wherein the electrostatic capacitance change sensitivity adjusting parameter and the feedback capacitor switching error correction parameter correspond to the first signal from the switching element.

7. The capacitive physical quantity detector according to claim 1,
wherein the processor multiplies an integration parameter by the second output signal of the converting unit, so that the electrostatic capacitance change sensitivity is adjusted, and the error is corrected,
wherein the integration parameter is obtained by integrating an electrostatic capacitance change sensitivity adjusting parameter and a feedback capacitor switching error correction parameter, and
wherein the electrostatic capacitance change sensitivity adjusting parameter and the feedback capacitor switching error correction parameter correspond to the first signal from the switching element.

8. A capacitive physical quantity detector, comprising:
a capacitance unit having an electrostatic capacitance, which is changeable according to a physical quantity;
a converting unit for converting an electrostatic capacitance change to a voltage; and
a selecting unit,
wherein the converting unit includes a capacitance-voltage converting circuit, which has an operational amplifier for amplifying an first output signal from the capacitance unit, a main switch disposed between an input terminal and an output terminal of the operational amplifier, a plurality of feedback capacitors and a plurality of feedback switches,
wherein each feedback switch is connected in series with a corresponding feedback capacitor,
wherein each feedback switch connects a corresponding feedback capacitor in parallel to the main switch when the feedback switch is closed,
wherein the selecting unit selects at least one of the feedback switches based on a second output signal of the converting unit so that the at least one of the feedback switches is closed,
wherein the selecting unit includes a comparator and a switching element,
wherein the comparator compares a voltage of the second output signal from the converting unit with a predetermined threshold voltage,
wherein the switching element switches the feedback switches according a third output signal from the comparator so as to set a voltage of the second output signal of the converting unit smaller than a saturated voltage of the second output signal of the converting unit and larger than the threshold voltage,
wherein the comparator switches a voltage level of the third signal according to determination whether a voltage of the second output signal is larger than the threshold voltage,
wherein the switching element switches the feedback switches in turn so as to increase an electrostatic capacitance of the feedback capacitors connected in parallel to the main switch at every time when the switching element switches the feedback switches until the comparator switches the voltage level of the third output signal of the comparator,
wherein the threshold voltage is a half of the saturated voltage, and
wherein the switching element switches the feedback switches in turn so as to double the electrostatic capacitance of the feedback capacitors connected in parallel to the main switch at every time when the switching element switches the feedback switches until the comparator switches the voltage level of the third output signal of the comparator.

9. A capacitive physical quantity detector, comprising:
a capacitance unit having an electrostatic capacitance, which is changeable according to a physical quantity;
a converting unit for converting an electrostatic capacitance change to a voltage;
a selecting unit; and
a controller,
wherein the converting unit includes a capacitance-voltage converting circuit, which has an operational amplifier for amplifying an first output signal from the capacitance unit, a main switch disposed between an input terminal and an output terminal of the operational amplifier, a plurality of feedback capacitors and a plurality of feedback switches,
wherein each feedback switch is connected in series with a corresponding feedback capacitor,
wherein each feedback switch connects a corresponding feedback capacitor in parallel to the main switch when the feedback switch is closed,
wherein the selecting unit selects at least one of the feedback switches based on a second output signal of the converting unit so that the at least one of the feedback switches is closed,
wherein the selecting unit includes a comparator and a switching element,
wherein the comparator compares a voltage of the second output signal from the converting unit with a predetermined threshold voltage,
wherein the switching element switches the feedback switches according to a third output signal from the comparator so as to set a voltage of the second output signal of the converting unit smaller than a saturated voltage of the second output signal of the converting unit and larger than the threshold voltage,
wherein the comparator includes a plurality of comparator elements having different threshold voltages, respectively,
wherein the switching element switches to close the feedback switches according to voltage levels of third output signals output from the plurality of comparator elements,
wherein the controller forcibly controls the switching element independently of the third output signals, wherein the converting unit further includes a reference power source for applying a reference voltage to the operational amplifier,
wherein the operational amplifier has two input terminals,
wherein one input terminal is coupled with the capacitance unit,
wherein the other input terminal is coupled with the reference power source, and
wherein the controller forcibly controls the switching element under a condition that the reference power source varies the reference voltage, so that the feedback switches are selected.

* * * * *